US009912201B2

(12) United States Patent
Oettinger

(10) Patent No.: US 9,912,201 B2
(45) Date of Patent: Mar. 6, 2018

(54) SYSTEMS AND METHODS OF DETECTING A CHANGE IN OBJECT PRESENCE IN A MAGNETIC FIELD

(75) Inventor: Eric Gregory Oettinger, Rochester, MN (US)

(73) Assignee: Texas Instruments Incorporated, Dallas, TX (US)

( * ) Notice: Subject to any disclaimer, the term of this patent is extended or adjusted under 35 U.S.C. 154(b) by 460 days.

(21) Appl. No.: 13/084,510

(22) Filed: Apr. 11, 2011

(65) Prior Publication Data

US 2012/0256620 A1 Oct. 11, 2012

(51) Int. Cl.
*H02J 7/00* (2006.01)
*H01F 27/42* (2006.01)
*H01F 37/00* (2006.01)
*H01F 38/00* (2006.01)
*H02J 50/90* (2016.01)
*G01R 33/00* (2006.01)
*G01R 33/028* (2006.01)
*H02J 5/00* (2016.01)
*H02J 7/02* (2016.01)
*H04B 5/00* (2006.01)
*H02J 50/12* (2016.01)
*H01F 38/14* (2006.01)

(52) U.S. Cl.
CPC .......... *H02J 50/90* (2016.02); *G01R 33/0041* (2013.01); *G01R 33/028* (2013.01); *H02J 5/005* (2013.01); *H02J 7/025* (2013.01); *H02J 50/12* (2016.02); *H04B 5/0037* (2013.01); *H04B 5/0081* (2013.01); *H01F 38/14* (2013.01)

(58) Field of Classification Search
CPC .. H02J 7/025; H02J 50/10; H02J 50/12; H02J 50/50; H02J 50/60
USPC .......................................... 320/108; 307/104
See application file for complete search history.

(56) References Cited

U.S. PATENT DOCUMENTS

| 5,731,698 A * | 3/1998 | Fujii .................. G01R 19/0053 |
| | | 324/76.12 |
| 8,248,028 B2 * | 8/2012 | Toya et al. ..................... 320/108 |
| 2002/0136337 A1 * | 9/2002 | Chatterjee et al. ........... 375/355 |
| 2006/0022636 A1 | 2/2006 | Xian et al. |

(Continued)

FOREIGN PATENT DOCUMENTS

| BE | WO 2009081115 A1 * | 7/2009 | .............. H02J 5/005 |
| CN | 1826715 | 8/2006 | |

(Continued)

OTHER PUBLICATIONS

PCT Search Report dated Oct. 23, 2012.

(Continued)

*Primary Examiner* — David V Henze-Gongola
(74) *Attorney, Agent, or Firm* — William B. Kempler; Charles A. Brill; Frank D. Cimino

(57) ABSTRACT

The systems and methods of detecting a change in object presence in a magnetic field disclosed herein inject a low amplitude signal near the resonant frequency into the coil until the system comes to equilibrium. At this point the feedback is measured. The feedback signal can be measured as at least one of several signals, for example, but not limited to the voltage on the resonant capacitor, the current in the coil, and the voltage between the resonant capacitor and the coil. A change in the steady state response indicates a change in device presence.

9 Claims, 3 Drawing Sheets

(56) References Cited

U.S. PATENT DOCUMENTS

| | | | |
|---|---|---|---|
| 2007/0182367 A1 | 8/2007 | Partovi | |
| 2007/0279829 A1* | 12/2007 | Gefter et al. | 361/213 |
| 2008/0139141 A1* | 6/2008 | Varghese et al. | 455/114.3 |
| 2009/0140691 A1* | 6/2009 | Jung | 320/108 |
| 2010/0187913 A1* | 7/2010 | Smith | H04B 5/0081 |
| | | | 307/104 |
| 2012/0139359 A1* | 6/2012 | Lai et al. | 307/104 |
| 2013/0119929 A1* | 5/2013 | Partovi | 320/108 |

FOREIGN PATENT DOCUMENTS

| | | |
|---|---|---|
| CN | 101512299 | 8/2009 |
| CN | 101535843 | 9/2009 |
| CN | 101971453 | 2/2011 |
| KR | 10-2005-0048315 | 5/2005 |
| KR | 1020050048315 | 5/2005 |
| KR | 10-2006-0107148 | 10/2006 |
| KR | 10-2010-0133557 | 12/2010 |
| KR | 1020100133557 | 12/2010 |
| WO | WO 2009081115 A1 * | 7/2009 |

OTHER PUBLICATIONS

China Search Report dated Mar. 30, 2015.
CN101535843A, English Machine Translation, 24 pages.
CN101512299A, English Machine Translation, 14 pages.
KR1020100133557, English Machine Translation, 13 pages.
KR1020050048315, English Machine Translation, 10 pages.
CN1826715A, English Machine Translation, 12 pages.
CN101971453A, English Machine Translation, 130 pages.

\* cited by examiner

SYSTEMS AND METHODS OF DETECTING A CHANGE IN OBJECT PRESENCE IN A MAGNETIC FIELD

TECHNICAL FIELD

The present disclosure is generally related to magnetic fields and, more particularly, is related to wireless power transmission.

BACKGROUND

Wireless energy transfer or wireless power is the transmission of electrical energy from a power source to an electrical load without interconnecting wires. Wireless transmission is useful in cases where interconnecting wires are inconvenient, hazardous, or impossible. With wireless power transmission, efficiency is an important parameter.

A common form of coupling in wireless power transmission is inductive coupling. A wireless power transfer system usually consists of electromagnetically coupled transmitting and receiving coils. Energy from the primary side can be transferred to the secondary side over a distance using the coil coupling. Electromagnetic induction wireless transmission techniques are near field over distances comparable to a few times the diameter of the device or devices approaching one quarter of the wavelength used.

Electromagnetic induction works on the principle of a primary coil generating a predominantly magnetic field and a secondary coil being within that field so that a current is induced in the secondary. Coupling should be tight in order to achieve high efficiency. As the distance from the primary is increased, more and more of the magnetic field misses the secondary. Even over a relatively short range the induction method is rather inefficient, wasting much of the transmitted energy.

Common uses of inductive coupling chargers are charging the batteries of portable devices such as laptop computers, cell phones, medical implants, and electric vehicles. Resonant converters may be used in both the wireless charging pad (the transmitter circuit) and the receiver module (embedded in the load) to maximize energy transfer efficiency. This approach is suitable for universal wireless charging pads for portable electronics such as mobile phones. It has been adopted as part of the Qi wireless charging standard. It is also used for powering devices having no batteries, such as RFID patches and contactless smartcards, and to couple electrical energy from the primary inductor to the helical resonator of Tesla coil wireless power transmitters.

Inductive charging is what happens when two devices—one designed to transmit power and the other designed to receive it—touch one another and energy is transferred between them. The power transmitting device projects an electromagnetic field. If the receiver is placed within that electromagnetic field, power may be transferred from the transmitter to the receiver. The receiver can be a power supply for any load. In one implementation, charging pads are able to intelligently communicate back and forth with the devices they're charging using the electronic field. In this application, the electromagnetic field used to transfer energy is modulated, allowing communication between the charging pad and the device it is charging. However, it is not always evident to the transmitting device whether there is an appropriate receiver within the electromagnetic field. Therefore, it would be useful to determine if an object were present in the electromagnetic field.

SUMMARY

Example embodiments of the present disclosure provide systems for detection of a change in object presence in a magnetic field. Briefly described, in architecture, one example embodiment of the system, among others, can be implemented as follows: a primary coil driven by an injected signal at a substantially constant frequency to create a magnetic field and configured to receive a response during a driving phase of the injected signal; and a controller configured to monitor a response to the injected signal and to determine a change in a presence of an object in the magnetic field emitted from the primary coil, the determination based on the monitored response.

Embodiments of the present disclosure can also be viewed as providing methods for detection of a change in object presence in a magnetic field. In this regard, one embodiment of such a method, among others, can be broadly summarized by the following steps: driving a primary coil with an injected signal at a substantially constant frequency to create a magnetic field; receiving a response during a driving phase of the injected signal; monitoring the response; and determining a change in object presence in the magnetic field emitted from the primary coil based on the monitored response.

DETAILED DESCRIPTION

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

The systems and methods of detecting a change in object presence in a magnetic field disclosed herein may be used in, for example, a wireless power transmitter application. However, the disclosed systems and methods may be applicable to other systems in which the detection of the presence, or change of presence, of an object in a magnetic field is advantageous. An example embodiment may be included in a wireless charging application in which object presence may be determined before charging is initiated.

Figure 1:
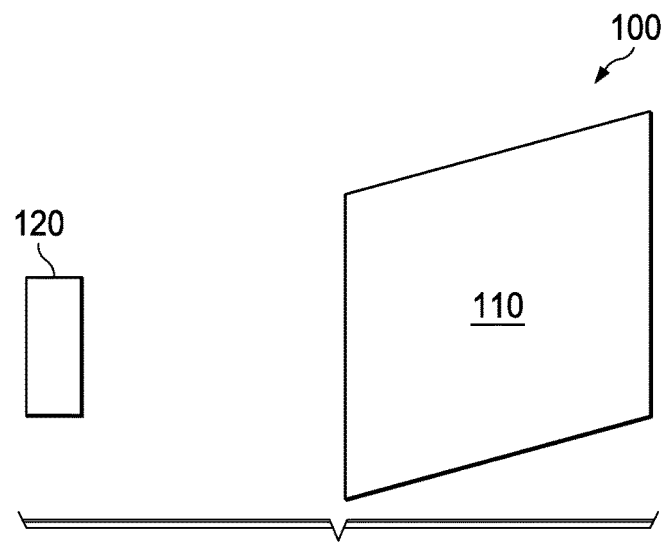
FIG. 1 is a system block diagram of an example embodiment of a system for detection of a change in object presence in a magnetic field.

FIG. 1 provides a system block diagram of system 100 to detect a change in object presence in a magnetic field. System 100 comprises object 120 and charger device 110 in an example wireless power system. In an example embodiment, charger device 110 determines the presence of object 120. After determining object presence, charger device 110 may be tasked with charging object 120 after generating a magnetic field and determining whether an object is present in the magnetic field.

Figure 2A:
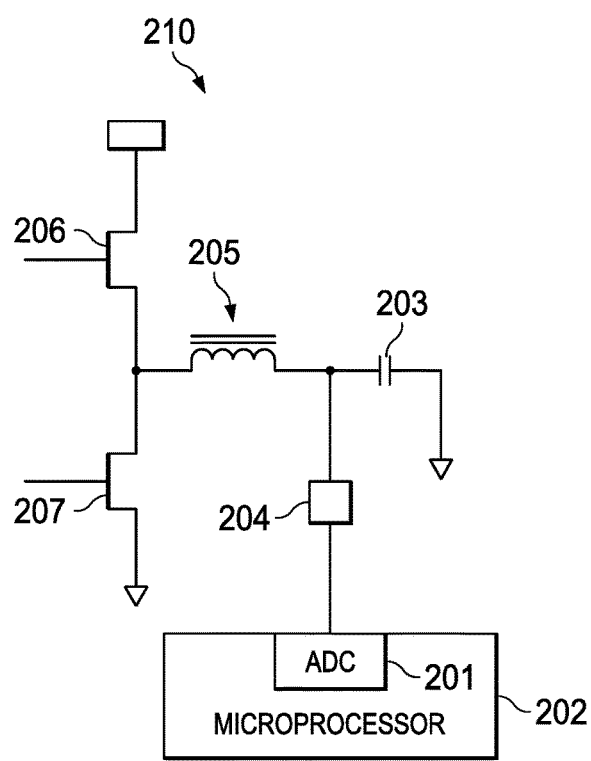
FIG. 2A is a circuit diagram of an example embodiment of a system for detection of a change in object presence in a magnetic field.

FIG. 2A provides circuit diagram 210 of an example embodiment of the system for detecting a change in object presence of FIG. 1. Circuit 210 comprises a half bridge power driver comprising FET 206, and FET 207, with coil 205 and capacitor 203. The voltage at the node between coil 205 and capacitor 203 is sampled through filter block 204 by analog to digital converter (ADC) 201. In this example embodiment, ADC 201 resides within microprocessor 202. Microprocessor 202 may also source the signals that drive FET 206, and FET 207.

In an example embodiment of circuit 210, a signal may be transmitted from coil 205 generating a magnetic field. Feedback from a device or object in the generated magnetic field may be detected by its reflected effects on coil 205 while coil 205 is being driven. In an example embodiment, if a receiver is detected, the transmitter may, for example, determine if the receiver is a device that is less than fully charged and may deliver power based on that determination. To conform to the Wireless Power Consortium specification, circuit 210 checks for a wireless device at least once every half-second. In previous systems, the check was done using a "digital ping" procedure. In a digital ping, the transmitter modulates the magnetic field at a frequency (for example, 175 kHz) well above the resonant frequency of the system (for example, 100 kHz) and waits for the receiver to respond. Functionally this works fine, but the handshake may take upward of 60 msec before the receiver responds, which means that even if no receiver is present, the transmitter will be actively driving the coil more than 10% of the time. (60 msec out of a 500 msec period).

An "analog ping" offers improved performance. In an example embodiment, circuit 210 issues a short burst near the resonant frequency and detects any impact an object might have on the response to that burst. In a resonant system, most objects in the vicinity of the inductive coupling will tend to damp the response. The burst can be on the order of milliseconds, or even microseconds, reducing the on-time to a much shorter duration.

In previous solutions, this has been implemented by sending a short number of pulses (3-10) at the resonant frequency, then low-pass filtering the response, and watching its rate of decay to detect the change in damping. There are several drawbacks to this approach. First, tolerances in the primary tank circuit may vary, affecting the resonant frequency. While the receiver's presence is expected to increase the damping of the system it may also change the resonant frequency, and if the resonance does not start out where it is expected, the resulting change may be unpredictable. Second, the low-pass filtering components are an additional expense and may require an additional analog to digital converter (ADC) input to the processor. Additionally, only the envelope of the response can be measured. If the receiver causes a change in resonant frequency, but little change in amplitude, the change in presence may go unnoticed. Changes from object presence to no object presence may vary by only a few percent and may be difficult to identify. Moreover, spatial differences affect the signal amplitude making detection more complex.

The systems and methods of detecting a change in object presence in a magnetic field disclosed herein inject a low amplitude signal near the resonant frequency into coil 205 until the system comes to equilibrium. At this point the feedback is measured. The feedback signal can be measured as at least one of several signals, for example, but not limited to the voltage on resonant capacitor 203, the current in coil 205, and the voltage between capacitor 203 and coil 205.

In example embodiments of the disclosed systems and methods, the response is sampled substantially synchronously to the driving frequency—and sampled while driving. The decay after the excitation has ended is not examined as in previous solutions. Instead, the steady state condition is examined while the circuit is energized. The response is not a fleeting glance at a transitory event, but, rather, is a steady repeating signal; therefore, the response is more easily captured with better resolution.

There are a number of issues to address in determining the sampling point in the period. First, it is possible that the combination of frequency change and phase shift could leave some objects indistinguishable from certain others. Second, the input to ADC 201 may be limited to positive inputs. In order to deal with both of these issues, the feedback may be sampled in two places in time which are 180° out of phase. Points spread by 180° guarantees that one will be positive. Though not required, sampling at the very end of the period (immediately before the injection), and at the midpoint of the period are preferred.

If experience with the system show that the amplitude of the response, without consideration of phase, is sufficient to detect a change in the presence of potential objects in the field, and the feedback does not fall outside of the limits of the ADC, an alternate sampling scheme can be employed which gives a more precise measure of amplitude. Separating sampling points by one quarter period (or 90 degrees) allows taking advantage of the trigonometric identity: $\sin^2 + \cos^2 = 1$. The sample points of a sine wave taken 90 degrees apart are equivalently the sine and cosine of that signal at some arbitrary phase. The amplitude normalization may compensate for potential phase shift. The calculated value formed by summing the square of the two sampled values, becomes a single value for detecting a change in object presence.

Relative to previously described analog ping solutions, in example embodiments, the injection signal may be smaller (in amplitude) and driven for a longer time. The difference between 50 usec (5 pulses at 100 kHz) and 1 msec (time to steady state) may seem large, but there is typically overhead in warming up the system before sending the first pulse. In an example application, there may be approximately 15 msec of wake-up time, so the difference is really 15.05 vs 16 msec. (In a 500 msec period, that is 3.01 vs 3.2 percent duty cycle.) The small injection amplitude also leads to minimal energy being expended. After a steady state condition has been reached (for example, at approximately 1 msec), the two feedback points may be sampled and recorded (sampling a few times and averaging can help reduce variation).

Figure 2B:
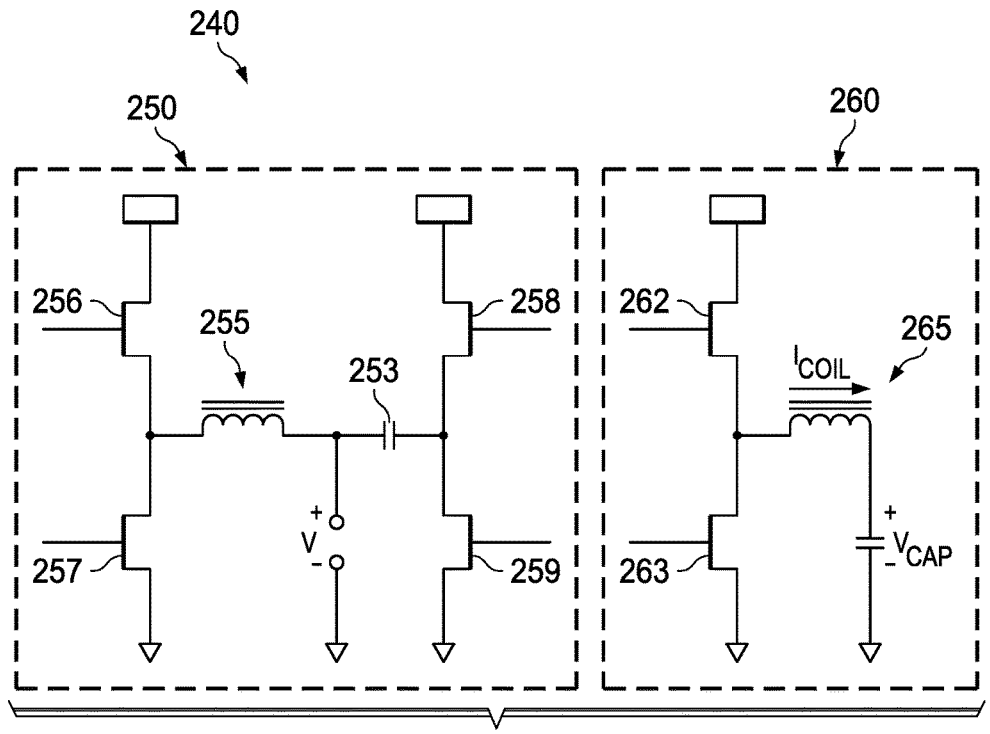
FIG. 2B is a circuit diagram of an example embodiment of a system for detection of a change in object presence in a magnetic field.

FIG. 2B provides circuit diagram 240 of an example embodiment of an inductive coupling application. Circuit 240 comprises primary charger circuit 250 and secondary charging circuit 260. In this example embodiment, primary circuit 250 comprises a full bridge power driver comprising FET 256, FET 257, FET 258, and FET 259 with primary coil 255. Secondary circuit 260 comprises half bridge comprising FET 262 and FET 263 with secondary coil 265. In an example embodiment of circuit 250, a signal may be transmitted from primary coil 255 generating a magnetic field. Feedback from a device or object in the generated magnetic field, such as a wireless device comprising secondary circuit 260, may be detected by its reflected effects on primary coil 205 while primary coil 205 is being driven. In an example embodiment, when a receiver is detected, the transmitter comprising primary circuit 250 may, for example, determine if the receiver comprising secondary circuit 260 is a device that is less than fully charged and may deliver power based on that determination.

Figure 3:
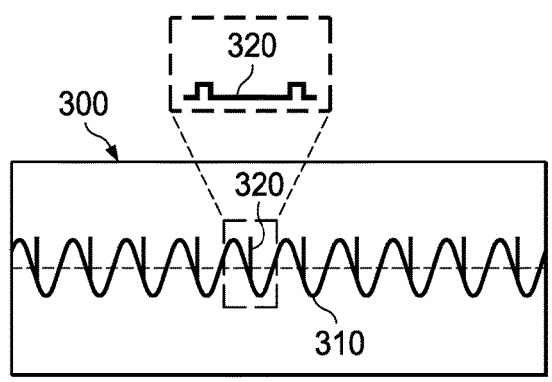
FIG. 3 is a signal diagram of an example embodiment of a signal using the system of FIG. 2.
Figure 4:
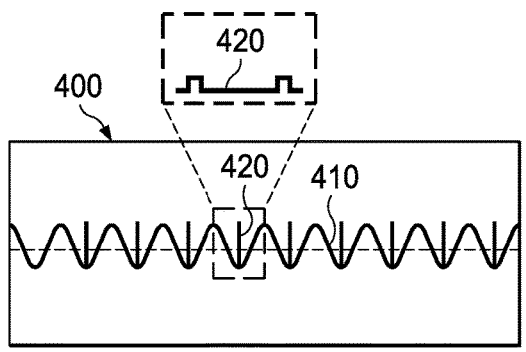
FIG. 4 is a signal diagram of an example embodiment of a signal using the system of FIG. 2.
Figure 5:
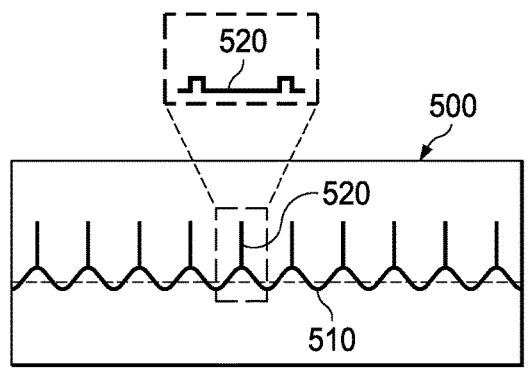
FIG. 5 is a signal diagram of an example embodiment of a signal using the system of FIG. 2.

FIG. 3 provides example signal diagram 300 of feedback signal 310 in response to an injected signal. The timing of the injected signal is indicated by spike signal 320. Signal diagram 300 of FIG. 3 is an example embodiment of when nothing is on charger device 110. The injected signal in FIG. 3, FIG. 4, and FIG. 5 is substantially the same level. However, though not shown in proportion in the figures, the amplitude of feedback 310 in the figures varies dependent on the object in the field. The feedback in FIG. 3, when no object is in the field, is determined as a base level condition.

FIG. 4 provides example signal diagram 400 when one or more paperclips are on the transmitter. Signal 410 is the feedback signal and signal 420 is a spike signal indicating the injected signal. Feedback signal 420 has a smaller amplitude relative to feedback signal 310. This change in the feedback indicates an object in the field.

FIG. 5 provides example signal diagram 500 when a shield and coil assembly is in the magnetic field with feedback signal 510 and spike signal 520. Feedback signal 510 has the smallest amplitude relative to feedback signal 310. There may be objects which do not cause a significant change in amplitude, but do result in a phase change in feedback signal 510 as compared to previous sampled feedback signals. An example might be if object causes the resonant peak to shift in frequency such that the resonant peak of the system moved from a point on one side of the injection frequency to the other side. This phase change can be used to determine a change in an object presence.

A goal of an example embodiment of the systems and methods disclosed herein is to facilitate the detection of an item on a wireless charging pad. The important thing to detect is a valid receiver, but anything metallic may be detected, from paperclips to keys to wireless receivers. In an example embodiment, the transmitter in charging device 110 wakes up from a sleep mode and sends a short burst, for example, for a millisecond, to determine if a change in object presence is detected. Then, in an example embodiment, depending on the change in the presence, a determination is made regarding whether a wireless receiver is present.

If, for example, circuit 210 enters into sleep mode with a fully charged device on the charger pad, when circuit 210 wakes up and transmits the analog ping, feedback indicating "no change" would indicate the fully charged device is still there and an attempt should not be made to charge it. A change would indicate the device had been removed (or replaced with another device) in which case some other method of object identification may be implemented, such as a digital ping as a non-limiting example. If a new object is detected, an attempt to charge may be initiated. If no receiver is determined to be present (for example, the digital ping fails) the state may be saved to determine a response to a change the next time the system awakes. The resulting course of action to the analog ping may depend on previous history.

Example embodiments of the systems and methods disclosed herein drive an injection or a ping signal substantially near a resonant frequency into coil 205 for a period of time, for example 1 millisecond, and waits for the response to reach a steady state condition. The steady state response to the ping signal is examined substantially synchronously to the injected signal. Sampling synchronously allows both the amplitude of the response and the phase relationship between the injected signal and the response signal to be measured—and thus a change detected.

In previous solutions, the measured signal was low-pass filtered in order to track the envelope of the response. However, in example embodiments of the systems and methods disclosed herein, the filtering may be eliminated. The feedback is examined for a change in object presence. If a change is detected in the feedback from the analog ping, a digital ping may be used to determine whether the object should be charged.

So signal 320, for example, as a 1% duty cycle square wave driven at 100 kHz, is injected into coil 205 to identify if a change in object presence has occurred. If a determination is made that an object was removed, then that condition may reset a state machine. If a determination is made that an object is there, a determination can then be made to determine if the object should be charged. To determine the change in object presence in the magnetic field, the feedback from an analog signal driven into coil 205 is monitored. To monitor the feedback, two points in the wave form are sampled. When signal 320 is driven into coil 205, the spike on the waveform occurs. The spike is an artifact caused by the switching, which conveniently provides the switching cycle boundary. In an example embodiment, to determine a change in object presence, two points are examined. The two points in this embodiment are selected as the point substantially just before spike 320 and, for example, a point 180 degrees after spike 320. Spike 320 is thus filtered out of the determination points when measuring the response.

Figure 6:
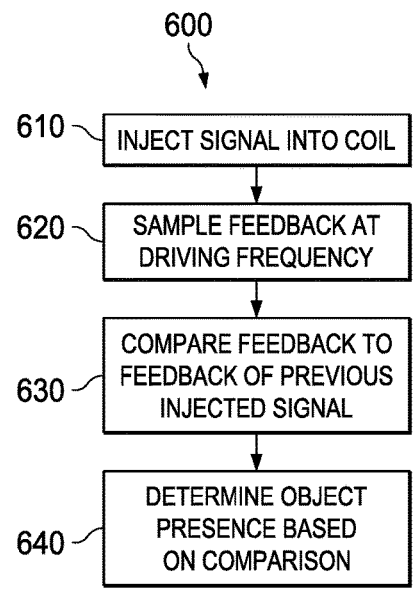
FIG. 6 is a flow diagram of an example embodiment of a method for detection of a change in object presence in a magnetic field.

FIG. 6 provides flow diagram 600 of a method to detect a change in object presence in a magnetic field. In block 610, a signal is injected into a coil. In block 620, the feedback from the injected signal is sampled at the driving frequency until it the feedback reaches a steady state condition. In block 630, the feedback is compared to the steady state feedback of the previous injected signal. Alternatively, the feedback may be compared to some predetermined threshold based on known system behavior. In block 640, the change in object presence is determined based on the comparison.

Although the present invention has been described in detail, it should be understood that various changes, substitutions and alterations can be made thereto without departing from the spirit and scope of the invention as defined by the appended claims.

Therefore, at least the following is claimed:

1. A method of operating a wireless charging circuit determining change in object presence in a magnetic field comprising:
during a time period in which the wireless charging circuit does not deliver power to a load, driving a primary coil with an injected signal at a substantially constant frequency to create a magnetic field, the injected signal being at a substantially lower duty cycle signal than a signal used to transmit power;

measuring passively generated effects on amplitude of a feedback signal during a driving phase of the injected signal after the signal reaches a steady-state;

monitoring the passively generated effects;

determining a change in object presence in the magnetic field emitted from the primary coil based on a comparison of the monitored passively generated effects with a previous determination of the passively generated effects, the determination being absence of a receiver, presence of a non-receiver object or presence of a receiver in the magnetic field, wherein object detection is determined before charging a device in the magnetic field is initiated; and further comprising sampling the passively generated monitored effects substantially synchronously to the injected signal in at least two points, at least one point having a phase difference of substantially 180 degrees with respect to the injected signal and another point having a phase difference of substantially 90 degrees with respect to the injected signal.

2. The method of claim 1, wherein the injected signal is an analog signal transmitted from the primary coil at substantially a resonant frequency.

3. The method of claim 2, wherein the monitored passively generated effects are in response to the transmitting of the analog signal.

4. The method of claim 1, wherein the sampling is performed after the sampled effects have reached a steady state condition.

5. The method of claim 1, wherein the monitored passively generated effects are detected on at least one of: voltage on a resonant capacitor, current in the primary coil, and voltage node between the resonant capacitor and the primary coil.

6. A wireless charging system comprising:
a charger for providing power at a first amplitude to a receiver comprising:
a power control circuit;
a primary coil driven by an injected signal from the power control circuit at a substantially constant frequency at a second amplitude less than the first amplitude and insufficient for power delivery to operate a receiver to create a magnetic field and configured to measure amplitude of passively generated effects on a feedback signal during a driving phase of the injected signal after the signal reaches a steady-state; and a controller configured to compare the measured amplitude of the feedback signal with passively generated effects in a previous measurement and to determine a change in presence of an object in the magnetic field emitted from the primary coil, the determination being absence of a receiver, presence of a non-receiver object or presence of a receiver in the magnetic field, wherein object detection is determined before charging a device in the magnetic field is initiated;

wherein the measured passively generated effects are sampled substantially synchronously with the injected signal in at least two points one point having a substantially 180 degree phase difference with respect to the injected signal and another point having a phase difference of substantially 90 degree with respect to the injected signal.

7. The wireless charging system of claim 6, wherein the injected signal is an analog signal transmitted from the primary coil at substantially a resonant frequency of the primary coil.

8. The wireless charging system of claim 7, wherein the measured passively generated effects are a response to the analog signal.

9. The wireless charging system of claim 6, wherein the sampling is performed after the sampled effects have reached a steady state condition.

* * * * *